United States Patent
Yang et al.

(10) Patent No.: US 11,217,742 B2
(45) Date of Patent: Jan. 4, 2022

(54) BOTTOM ELECTRODE FOR SEMICONDUCTOR MEMORY DEVICE

(71) Applicant: International Business Machines Corporation, Armonk, NY (US)

(72) Inventors: Chih-Chao Yang, Glenmont, NY (US); Theodorus E Standaert, Clifton Park, NY (US); Daniel C Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/139,372

(22) Filed: Sep. 24, 2018

(65) Prior Publication Data
US 2020/0098975 A1    Mar. 26, 2020

(51) Int. Cl.
*H01L 43/02* (2006.01)
*H01L 43/12* (2006.01)
*H01L 27/22* (2006.01)

(52) U.S. Cl.
CPC ............ *H01L 43/02* (2013.01); *H01L 27/222* (2013.01); *H01L 43/12* (2013.01)

(58) Field of Classification Search
CPC . H01L 43/12; H01L 21/768; H01L 21/76871; H01L 43/02; H01L 27/222; H01L 43/08
See application file for complete search history.

(56) References Cited

U.S. PATENT DOCUMENTS

| | | | | |
|---|---|---|---|---|
| 6,153,935 | A * | 11/2000 | Edelstein | .............. H01L 21/288 257/276 |
| 9,461,245 | B1 | 10/2016 | Yang | |
| 9,876,169 | B2 | 1/2018 | Sung | |
| 10,559,751 | B1 * | 2/2020 | Yang | ....................... H01L 43/12 |
| 2013/0119496 | A1 | 5/2013 | Zeng | |
| 2015/0060856 | A1 | 3/2015 | Tyberg | |
| 2015/0069556 | A1 | 3/2015 | Yamakawa | |
| 2015/0255718 | A1 | 9/2015 | Liu | |

(Continued)

OTHER PUBLICATIONS

W. M. Haynes, ed., CRC Handbook of Chemistry and Physics, 97th Edition, 2017, pp. 5-78-5-84 (Year: 2017).*

(Continued)

*Primary Examiner* — Shih Tsun A Chou
(74) *Attorney, Agent, or Firm* — Jeffrey S LaBaw; Steven J Meyers; L Jeffrey Kelly

(57) ABSTRACT

A structure and a method for fabricating a bottom electrode for an integrated circuit device are described. A first dielectric layer is provided over a substrate and the first dielectric layer has a recess. A bottom electrode is formed over the recess. The bottom electrode consists of a microstud layer disposed completely within the recess of the dielectric and conforming to the recess, a bottom pedestal disposed on a top surface of the microstud and a top pedestal on a top surface of the bottom pedestal. The material used for the bottom pedestal has a lower electrochemical voltage than a material used for the microstud. A conductive element of the integrated circuit device is formed on a top surface of the bottom electrode. A first portion of the bottom electrode is disposed in and conforms to the recess. A second portion of the bottom electrode and the conductive element are conical sections.

12 Claims, 19 Drawing Sheets

(56) References Cited

U.S. PATENT DOCUMENTS

| | | | |
|---|---|---|---|
| 2015/0311253 A1 | 10/2015 | Choi | |
| 2016/0064648 A1* | 3/2016 | Tsubata | H01L 43/02 |
| | | | 257/421 |
| 2016/0141490 A1* | 5/2016 | Jung | H01L 23/481 |
| | | | 257/421 |
| 2016/0365512 A1 | 12/2016 | Sung | |
| 2017/0062031 A1 | 3/2017 | Han | |
| 2018/0040819 A1 | 2/2018 | Fraczak | |
| 2018/0261759 A1* | 9/2018 | Bhosale | H01L 43/12 |
| 2019/0165258 A1* | 5/2019 | Peng | H01L 43/08 |
| 2019/0214554 A1* | 7/2019 | Li | H01F 10/329 |

OTHER PUBLICATIONS

Chen et al., Oxidation behavior of titanium nitride films, J. Vac. Sci. Technol. A 23, 1006 (2005) (Year: 2005).*

IBM Patents or Patent Applications Treated as Related.

* cited by examiner

BOTTOM ELECTRODE FOR SEMICONDUCTOR MEMORY DEVICE

BACKGROUND OF THE INVENTION

This disclosure relates to integrated circuit devices, and more specifically, to a method and structure to improve the properties of bottom electrode structures in semiconductor devices.

In semiconductor circuits, the devices fabricated in or on a semiconductor substrate are connected with a metallic interconnection structure made of metal lines and "vias" which interconnect the metal lines. The metal lines are arranged in horizontal layers, i.e. parallel to the substrate, and separated by layers of dielectrics while vias are disposed vertically in openings in the dielectric to interconnect the layers of metal lines.

Magnetoresistive random-access memory (MRAM) is a non-volatile random-access memory technology. Although the technology has been in development since the mid-1980s, the improvements in existing memory technologies, e.g., in flash RAM and DRAM, have kept MRAM in a niche role. Nonetheless, the technology has great promise such that many believe that MRAM will eventually become the dominant type of memory in the market. Data in MRAM is not stored as electric charge or current flows, but by magnetic storage elements. The elements are formed from ferromagnetic plates typically comprised of a magnetic tunnel junction (MTJ) material. Each of the plates hold a magnetization, separated by a thin insulating layer. In some MRAMs, one of the two plates is a permanent magnet set to a particular polarity, while the other plate magnetization is variable, so that it can be changed to match that of an external electromagnetic field to store memory.

As the dimensions of the interconnection structure for an MRAM device have become smaller, challenges have been experienced to provide an adequate contact structure. One of the problems is that there is a chemical reaction between the pedestal and microstud elements of the contact structure resulting in galvanic related corrosion. Another of the problems experienced is that the fill quality of the current process is inadequate, leading to device reliability problems. Another issue is that redeposition of the already deposited layers causes reliability problems in the device structure, and therefore, the integrated circuit in which it is incorporated.

Thus, producing an improved interconnection structure is desirable. The present disclosure presents a method and structure to address the above described problems.

BRIEF SUMMARY

According to this disclosure, a structure and a method for fabricating a bottom electrode for an integrated circuit device. A first dielectric layer is provided over a substrate and the first dielectric layer has a recess. A bottom electrode is formed over the recess. The bottom electrode consists of a microstud layer disposed completely within the recess of the dielectric and conforming to the recess, a bottom pedestal disposed on a top surface of the microstud and a top pedestal on a top surface of the bottom pedestal. The material used for the bottom pedestal has a lower electrochemical voltage than a material used for the microstud. A conductive element of the integrated circuit device is formed on a top surface of the bottom electrode. A first portion of the bottom electrode is disposed in and conforms to the recess. A second portion of the bottom electrode and the conductive element are conical sections.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
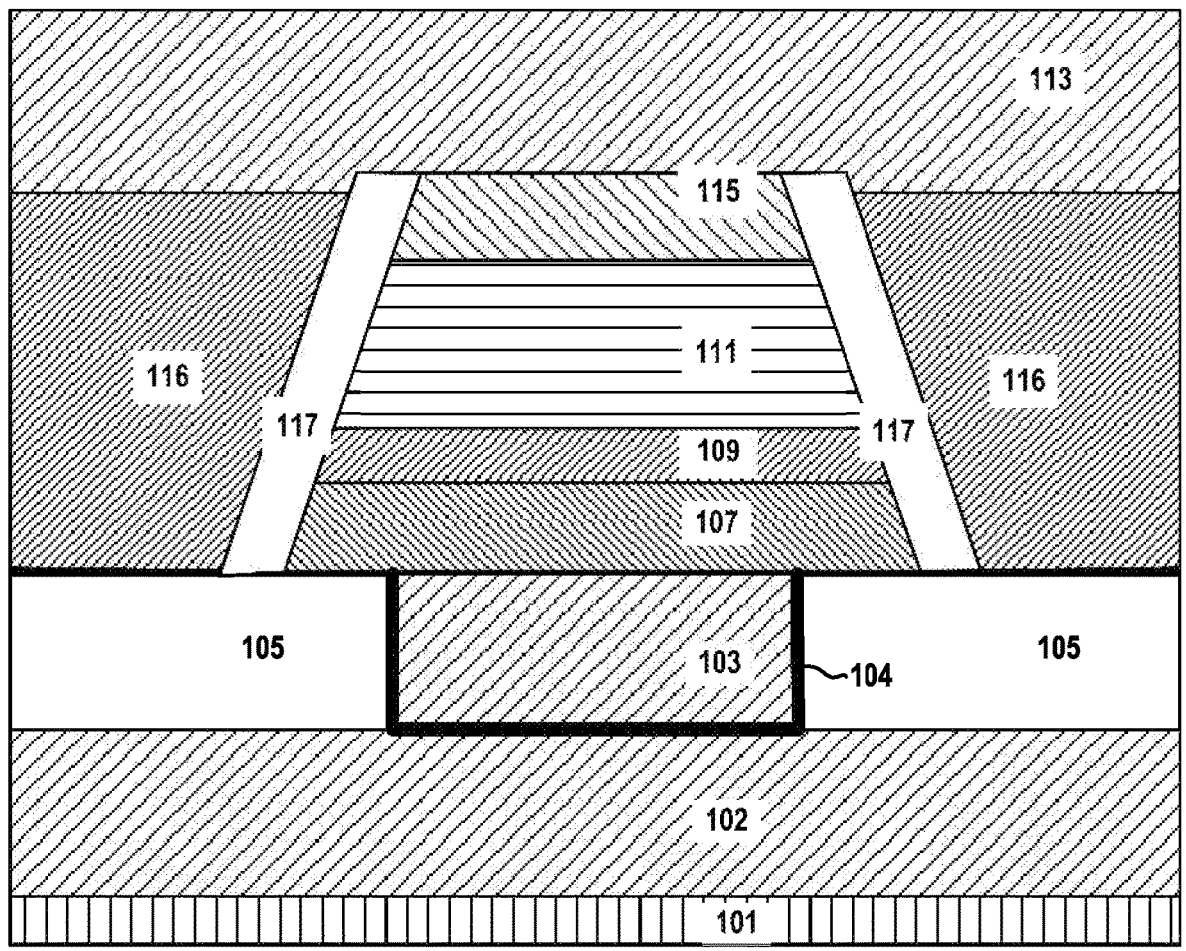
FIG. 1 is a cross-sectional diagram depicting a contact structure for a Magnetoresistive random-access memory (MRAM) device.

At a high level, embodiments of the invention provide a bilayer pedestal on top of a metal microstud in a Magnetoresistive random-access memory (MRAM) device. The material for the bottom pedestal of the bilayer pedestal is selected to have good gap fill quality and no chemical reaction with the underlying microstud. The microstud is copper in embodiments of the invention. The material for the top pedestal of the bilayer pedestal is selected to have a fast deposition rate and a high oxidation rate (activation energy of forming oxide less than 80 kcal/mol) during an Ion-beam etch (IBE) process which is used to shape the magnetic tunnel junction (MTJ) material layer used in the MRAM device. Compatibility with the MTJ layer is also needed. By providing a bilayer pedestal rather than a single layer, two materials, potentially with different deposition processes and with the best properties for compatibility with different layers of the device are selected.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. As discussed in the specification, the dielectrics are considered high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). Dielectrics with low dielectric constants, e.g., SiO2, have relative dielectric constants of 3.8 or below. Representative low-k dielectrics have dielectric constants equal or lower than 3.5. Examples of low-k dielectrics include porous SiO2, and carbon doped SiO2. The dielectric can be a combination of two or more of these materials. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

"Electrically conductive" and/or "electrical conductor" as used through the present disclosure means a material typically having a room temperature resistivity less than about 400 µΩ-cm. As used herein, the terms "insulator" and "dielectric" denote a material having a room temperature resistivity greater than about 400 µΩ-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting a contact structure for a Magneto-resistive random-access memory (MRAM) device. The device is deposited on a substrate 101 which in preferred embodiments includes a dielectric such silicon dioxide (SiO2). The bottom interconnect 102 is fabricated from a conductive material, for example, a metal such as W, Cu, Al, or alloys thereof. The bottom interconnect 102 is shown in cross section and is typically a conductive line used to interconnect the MRAM devices or other devices in the integrated circuit. Although only a single structure is shown for ease in illustration, the device structure is usually more complicated and includes a plurality of metal lines and MRAM devices.

A microstud layer 103 is formed in an insulator layer 105. The microstud 103 is a conductive material such as W, Cu, Al, or alloys thereof. Some of the appropriate insulator materials for layer 105 include SiO2, SiN, SiC, and low-k dielectric materials. A liner layer 104 is shown in black in the figure. It provides a diffusion barrier and adhesion liner functions and can be made of materials such as Ta(N), W(N), Ti(N), Ru or Co.

A bilayer pedestal is built on top of the metal microstud 103 and is comprised of a bottom pedestal 107 and a top pedestal 109. The material selected for the bottom pedestal 107 should have good gap-fill quality and have no chemical reactions with the material selected for the microstud 103. For example, if copper is selected for the microstud 103, the bottom pedestal material should have less electrochemical voltage than copper so that during a subsequent process such as a wet clean or chemical mechanical polishing process no reactions take place. In addition to having a lower electrochemical voltage, the bottom pedestal 107 should have a good atomic level of lattice match to the material which makes up the microstud 103. Although specific materials will be discussed below for different embodiments, in preferred embodiments, the bottom pedestal 107 is a pure metal, metal nitride, or an alloy. The material for the top pedestal 109 is selected to have a fast deposition rate and less surface morphology or roughness than the bottom pedestal 107 since the MTJ layer 111 will be deposited on top pedestal 109. Further, the material used for the top pedestal layer 109 should have a relatively low redeposition rate during the IBE process used to form the MRAM cell. The top pedestal material should have a high oxidation rate (e.g., an activation energy of forming oxide less than 80 kcal/mol). As the top pedestal 109 is in contact with the memory stack 111, it should have a good atomic level of lattice match to the memory stack material. In embodiments of the invention, a metal nitride or metal alloy is used for the top pedestal layer 109. In one embodiment of the invention, the top pedestal layer 109 is TiN, the bottom pedestal layer 107 in TaN and the microstud 103 material is Cu.

The three layers of the microstud 103, the bottom pedestal 107 and the top pedestal 109 will be referred to as the "bottom electrode" in places in the description of the invention.

Data in an MRAM device is stored as a magnetic polarization or magnetization in magnetic storage elements formed in the magnetic tunnel junction (MTJ) layer 111. Although depicted as a single layer 111, the elements are formed from two ferromagnetic plates, each of which can hold a magnetic polarization, separated by a thin insulating layer. In embodiments of the invention, one of the two plates is a permanent magnet set to a particular magnetic polarity, the reference plate; the other plate's magnetization can be changed to match that of an external field to store memory, the free plate. This arrangement is known as a magnetic tunnel junction. Each MRAM cell device stores an MRAM bit. A complete MRAM memory device is built from a grid of such "cells".

A hard mask layer 115 is deposited on top of the MTJ layer 111. A good material for the hard mask layer 115 is TaN. It protects the MRAM cell during the IBE process and also serves to connect the device with the top interconnect 113. The inter-layer dielectric (ILD) 116 and insulator 117 isolate the MRAM cell from the conductor layers 102, 113. Like the other conductor layers, the top interconnect 113 is a metal such as Cu, Al or W. The top interconnect 113 is a connective wire which connects the MRAM cell to other MRAM cells or other devices in the device. The ILD layer 116 is SiO2 or a low-k dielectric in embodiments of the invention. The encapsulation layer 117 is preferably an insulator such as SiN or SiC. The function of the encapsulation layer is to prevent oxygen or moisture diffusion from the ILD layer 116 to the MTJ layer 111.

The structure of the layers 103, 107, 109 (e.g., using Cu/TaN/TiN in the respective layers) underneath a memory stack 111 is novel. In the structure, the pedestal layers 107 (TaN) and layer 109 (TiN) are conical sections at bottom of the MTJ layer. In the structure, the TaN 107, TiN 109 and MTJ 111 sidewalls are capped with an encapsulation layer, e.g., SiN. Also, in embodiments of the invention, the top pedestal layer 109 is planarized over the entire portion incorporated in the pedestal.

Although the description is directed to an MRAM device, the bottom electrodes of the embodiments of the invention can be used in other memory devices. That is, the bottom electrode would interface with another type of memory cell.

Figure 2:
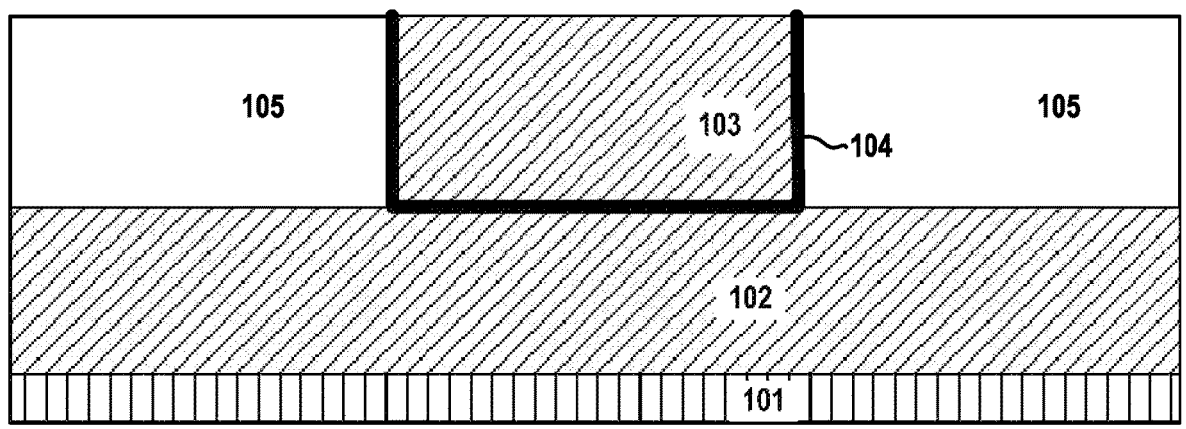
FIG. 2 is a cross-sectional diagram depicting an intermediate structure including a bottom conductor contact over a bottom interconnect according to a first embodiment of the invention.

FIG. 2 is a cross-sectional diagram depicting an intermediate structure including a bottom conductor contact over a bottom interconnect according to a first embodiment of the invention. The device is deposited on a substrate 101 such as a semiconductor wafer, or a substrate in which a number of dielectric layers and semiconductor material layers can be arranged to provide microelectronic devices, or smaller devices, which can include semiconductor devices, such as field effect transistors (FETs), fin type field effect transistors (FinFETs), bipolar junction transistors (BJT) and combinations thereof. The bottom interconnect 102 is fabricated from a conductive material, for example, a metal such as W, Cu, Al, or alloys thereof. Conventional deposition processes such as an atomic layer deposition (ALD), chemical vapor deposition (CVD), plasma enhanced chemical vapor deposition (PECVD), electroless plating to deposit the metal of the interconnect 102. The bottom interconnect 102 is shown in cross section and is typically a conductive line used to interconnect the MRAM devices or other devices in the integrated circuit. Normally, the bottom interconnect layers 102 in embodiments of the invention have respective thicknesses from 10 nm to 800 nm with thicknesses from 30 nm to 500 nm being more preferred.

A bottom conductor or microstud layer 103 is formed in an insulator layer 105 by patterning the insulator 105, e.g., a photoresist or hard mask layer is first patterned over the insulator layer. A subsequent etch, e.g., a reactive ion etch (RIE) process, creates a recess for the metal which will form the microstud 103. A barrier layer 104 such as Ta(N) is used to prevent diffusion of the microstud 103 into the insulator 105. Typically, the microstud layer 103 and insulator layer 105 have respective thicknesses from 4 nm to 300 nm in different embodiments with thicknesses from 5 nm to 280 nm being more preferred. A planarization process is performed to form the top surface of the microstud 103. A chemical mechanical polishing (CMP) step is a widely used planarization process which is used in embodiments of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. Other planarization processes are known to the art and are used in alternative embodiments of the invention.

Note that the top surface of the microstud layer 103 is flush with respect to the top surface plane of the insulator layer 105 in preferred embodiments of the invention after the CMP process.

In some embodiments, the insulator layer is a single dielectric material. In other embodiments, it may be composed of at least two different dielectric materials. The microstud metal layer 103 and barrier layer 104 can be deposited in one or more of a variety of processes known to the art, or invented in the future. The deposition processes include, for example, chemical vapor deposition (CVD), plasma enhanced chemical vapor deposition (PECVD), physical vapor deposition (PVD) or sputtering. Typical microstud metals include Cu, Al, Co, W, Ru, Ni, and alloys of the same. However, other metals can be used. Typical barrier layers include TaN, Ta, Ti, TiN, W, Ru, Ir, although other barrier layers are known to the art and are used in alternative embodiments of the invention.

Figure 3:
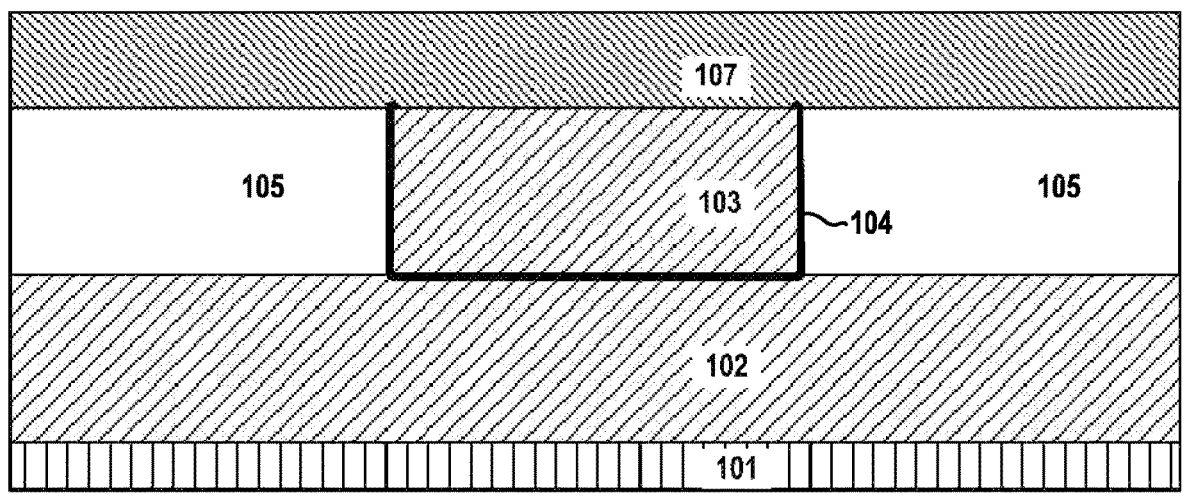
FIG. 3 is a cross-sectional diagram depicting the structure according to a first embodiment of the invention after a bottom layer of the bilayer pedestal is deposited.

FIG. 3 is a cross-sectional diagram depicting the structure according to a first embodiment of the invention after the material 107 which will form the bottom pedestal of the bilayer pedestal is deposited. The bottom pedestal 107 material should have a good atomic level of lattice match to the microstud 103 material. Although specific materials will be discussed below for different embodiments, the bottom pedestal 107 is a pure metal, a metal nitride, or an alloy of the two. Metals or nitrides selected from the group of Ta, W, Ti, Al, Ru, Rh, Ir, Co, Pt, Nb, Cr, Mo and Ni are used in embodiments of the invention.

The deposition processes for the bottom pedestal material include, for example, PVD, ionized physical vapor deposition (iPVD), atomic layer deposition (ALD), and CVD deposition processes in respective embodiments. Typically, as deposited, the bottom pedestal layer 107 has a thickness from 2 nm to 500 nm with a thickness from 5 nm to 300 nm being more preferred. The results are improved because of both higher material purity and faster process for PVD and iPVD than chemical type of deposition methods, e.g., CVD, ALD.

Figure 4:
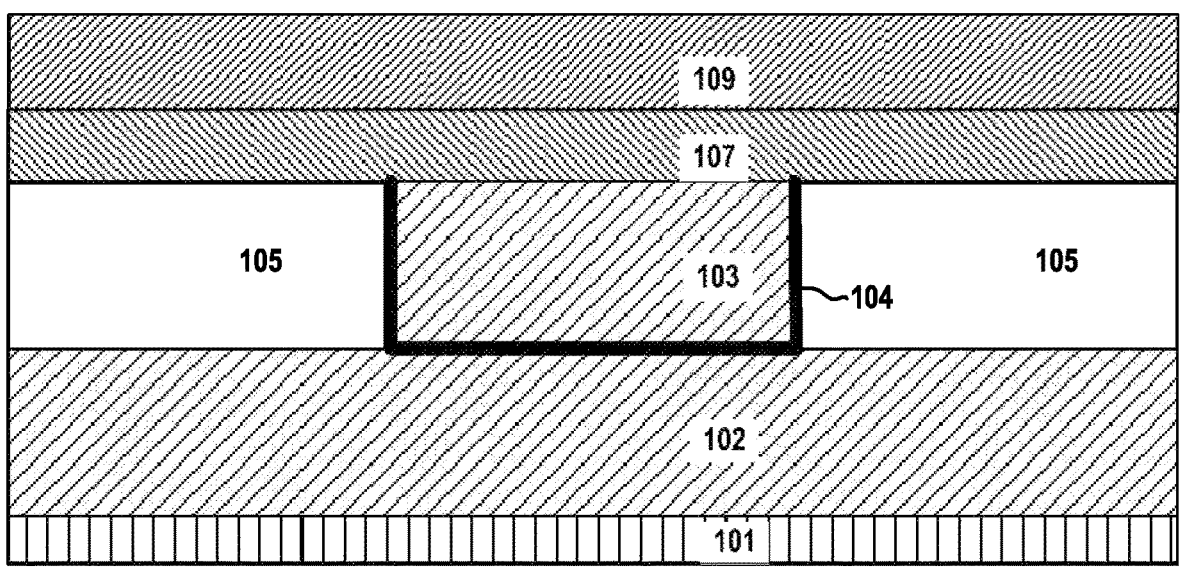
FIG. 4 is a cross-sectional diagram depicting the structure according to a first embodiment of the invention after a top layer of the bilayer pedestal is deposited.

FIG. 4 is a cross-sectional diagram depicting the structure according to a first embodiment of the invention after a top layer of the bilayer pedestal is deposited. The material 109 which will form the top pedestal of the bilayer pedestal is deposited as a metal nitride or an alloy layer 109. In preferred embodiments of the invention, the top pedestal layer 109 is comprised of a metal nitride or alloy of the group of metals consisting of Ta, W, Ti, Al, Ru, Rh, Ir, Co, Pt, Nb, Cr, Mo and Ni. In the first embodiment. An optional CMP (or other planarization) process is performed after the deposition to thin and planarize the top pedestal 109.

The deposition processes for the top pedestal material 109 include any method used to deposit the selected group of materials presently known or developed in the future. However, PVD and iPVD deposition processes are preferred based on experimental data. The inventors found that the results from these particular deposition processes produced unexpectedly good results as compared with other deposition results from other conventional processes used for depositing these materials. The results are improved because of both higher material purity and faster process for PVD and iPVD than chemical type of deposition methods, e.g., CVD, ALD. The formation of the top pedestal material 109 includes a thicker material layer than needed in the device in the embodiments where the deposition is followed by a planarization process. For example, the thicknesses of the top pedestal layers as deposited ranges from 2 nm to 400 nm with a thickness from 2 nm to 300 nm being more preferred.

Figure 5:
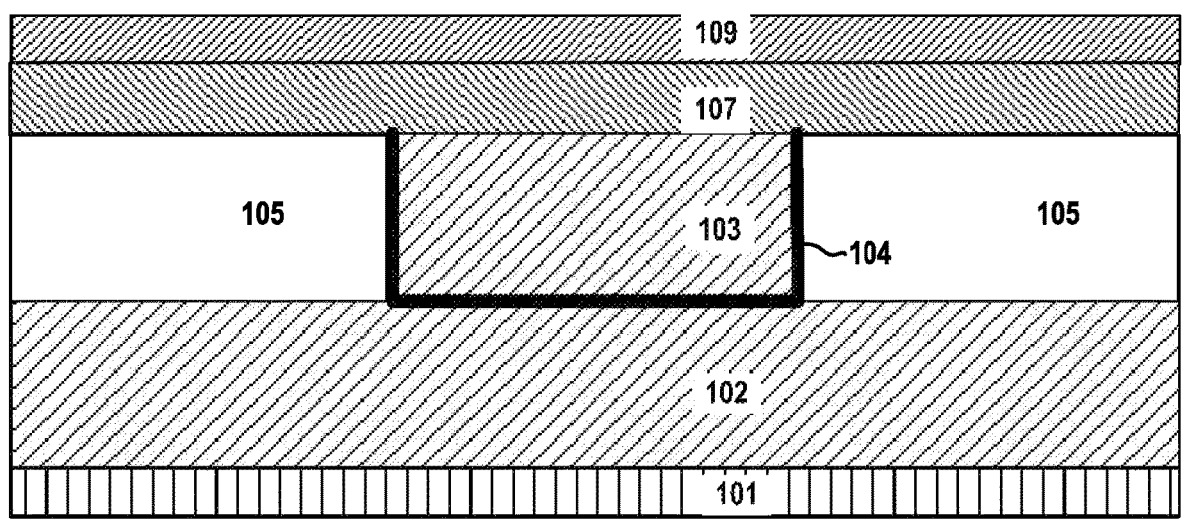
FIG. 5 is a cross-sectional diagram depicting the structure according to a first embodiment of the invention after a planarization process is performed on the top layer of the bilayer pedestal.

FIG. 5 is a cross-sectional diagram depicting the structure according to a first embodiment of the invention after a planarization process is performed on the top layer of the bilayer pedestal. In some embodiments, the planarization process is a CMP process as described above. As finally formed, the top pedestal layer 109 has a thickness from 1 nm to 300 nm with a thickness from 2 nm to 200 nm being more preferred. The planarization process provides a smooth top surface for subsequent layers like the MTJ layer.

Figure 6:
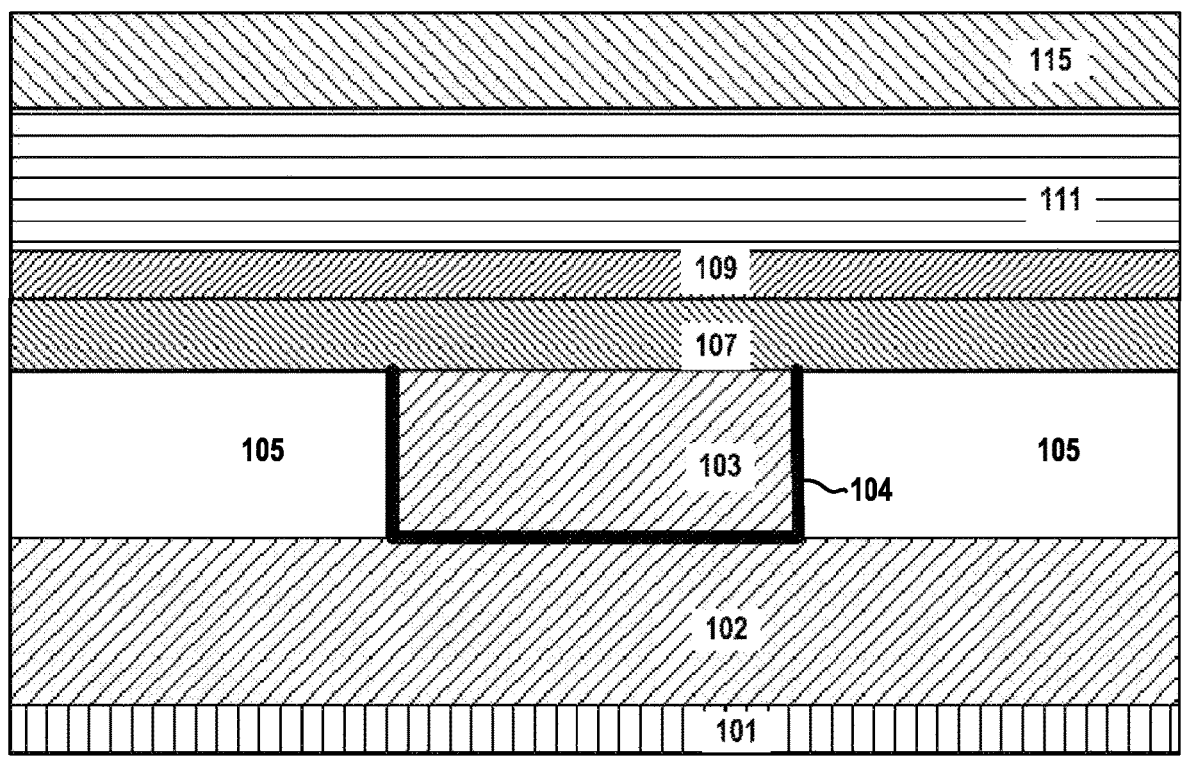
FIG. 6 is a cross-sectional diagram depicting the structure according to a first embodiment of the invention after a magnetic tunnel junction (MTJ) material layer and metal hard mask (HM) layer are deposited.

FIG. 6 is a cross-sectional diagram depicting the structure according to a first embodiment of the invention after deposition of a layer 111 onto top pedestal layer 109 in accordance with one or more embodiments. Hard mask layer 115 is deposited on top of layer 111. In the description above, the layer 111 is described as an MTJ layer. However, layer 111 can be formed of a single metal layer of metals such as copper, tungsten, aluminum, or alloys thereof or multiple layers thereof so as to define an interconnecting via between different metal line layers. In other words, layers 103, 105, 107 and 111 define a metal stack. i.e., alternating conductive metals. In the MTJ embodiments, magnetic and insulator layers form a memory stack, e.g., a magnetic tunnel junction (MTJ) structure with alternating magnetic layers and insulator layers. MTJ structures are known in the art. If layer 111 is a MTJ layer 111, a laminate structure, e.g., comprised of two ferromagnetic plates separated by a nonmagnetic material, such as a nonmagnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer. A known MTJ structure uses cobalt (Co), iron (Fe), boron (B), nickel (Ni), iridium (Ir), platinum (Pt), palladium (Pd), or any combination thereof as the reference layer. MgO (among other materials) is used as the tunnel barrier layer and CoFeB as the free layer. However, other MTJ layers 111 are known to the art and could be used in embodiments of the invention.

Further, as mentioned above layer 111 could comprise a memory cell of a different type than an MRAM cell.

Figure 7:
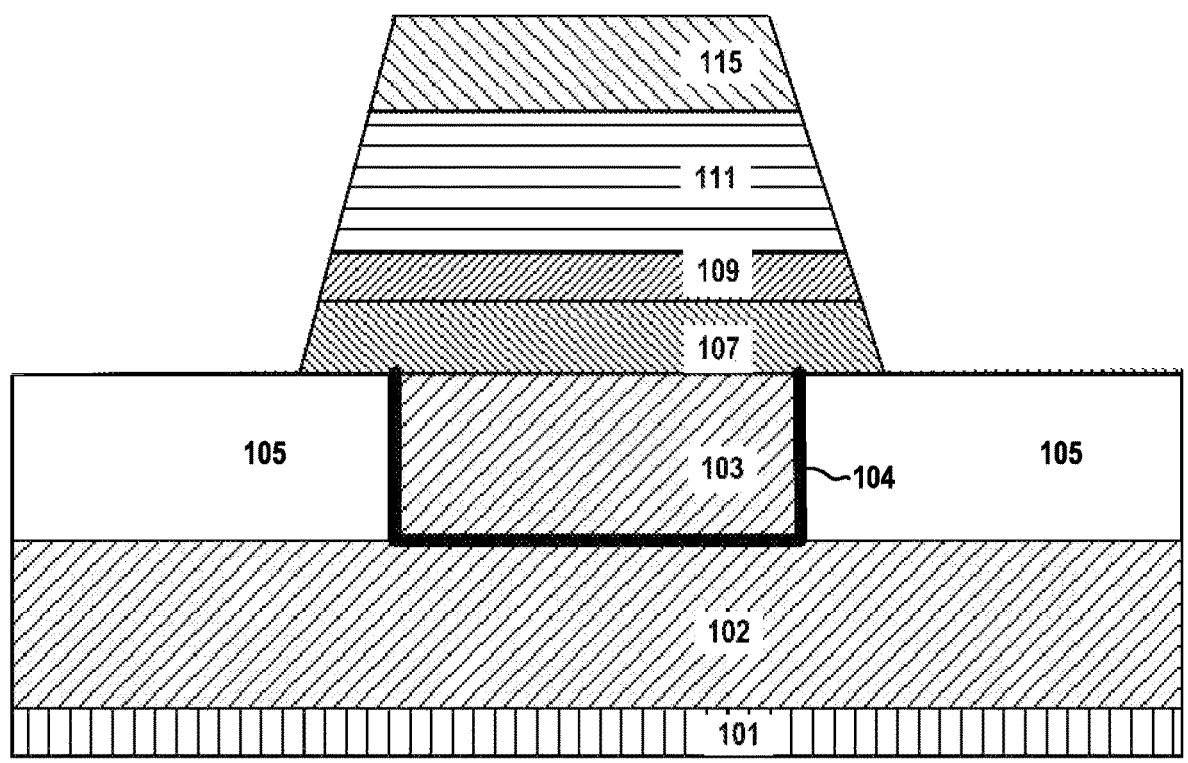
FIG. 7 is a cross-sectional diagram depicting the structure according to a first embodiment of the invention after an Ion-beam etch (IBE) process is performed.

FIG. 7 is a cross-sectional diagram depicting the structure according to a first embodiment of the invention after an Ion-beam etch (IBE) process is performed. An IBE process is performed by focusing relatively large ions, e.g., Ga+, Xe+, to physically sputter away the material on the surface of the targeted substrate. As shown, the IBE process cuts through the hardmask layer 115, the MTJ layer 111 and the top pedestal layer 109 of the pedestal. The process leaves an MRAM cell with an angular cross-section, e.g., a conical shape in three dimensions. As the IBE process can redeposit material on the substrate, the top pedestal 109 is selected to have relatively low redeposition rates to avoid redepositing the top pedestal layer material onto the patterned sidewall of the MTJ layer 111. While the MTJ layer 111 and hard mask layer 115 could redeposit, the problem is primarily one of a lower layer depositing on an already cut, formed layer. In the structure as shown, there is no layer above the hard mask layer 115 and material from MTJ layer 111 on the sidewall of hard mask layer 115 does not affect the functioning of the device. Other modified physical ion bombardment methods (eg. Ar+, He+) may be also used in other embodiments.

In the embodiment, the bottom pedestal layer 107 has a potential to redeposit on the MTJ layer 111. However, by controlling the thicknesses, e.g., the exposed thickness of the bottom layer 107 and the thickness of the top pedestal layer 109, the amount of redeposition of the bottom pedestal layer material on the MTJ layer 111 is minimized.

In some embodiments of the invention, the top pedestal 109 of the pedestal will have a smaller horizontal dimension than that of the bottom pedestal 107 and the bottom layer 107 will be larger than the microstud 103, overlapping the recess in the insulator 105. In such embodiments, it is advantageous to have the overlap as it will fully cover the microstud layer 103 during the IBE process, eliminating a possibility of undesirable etching of that layer.

Figure 8:
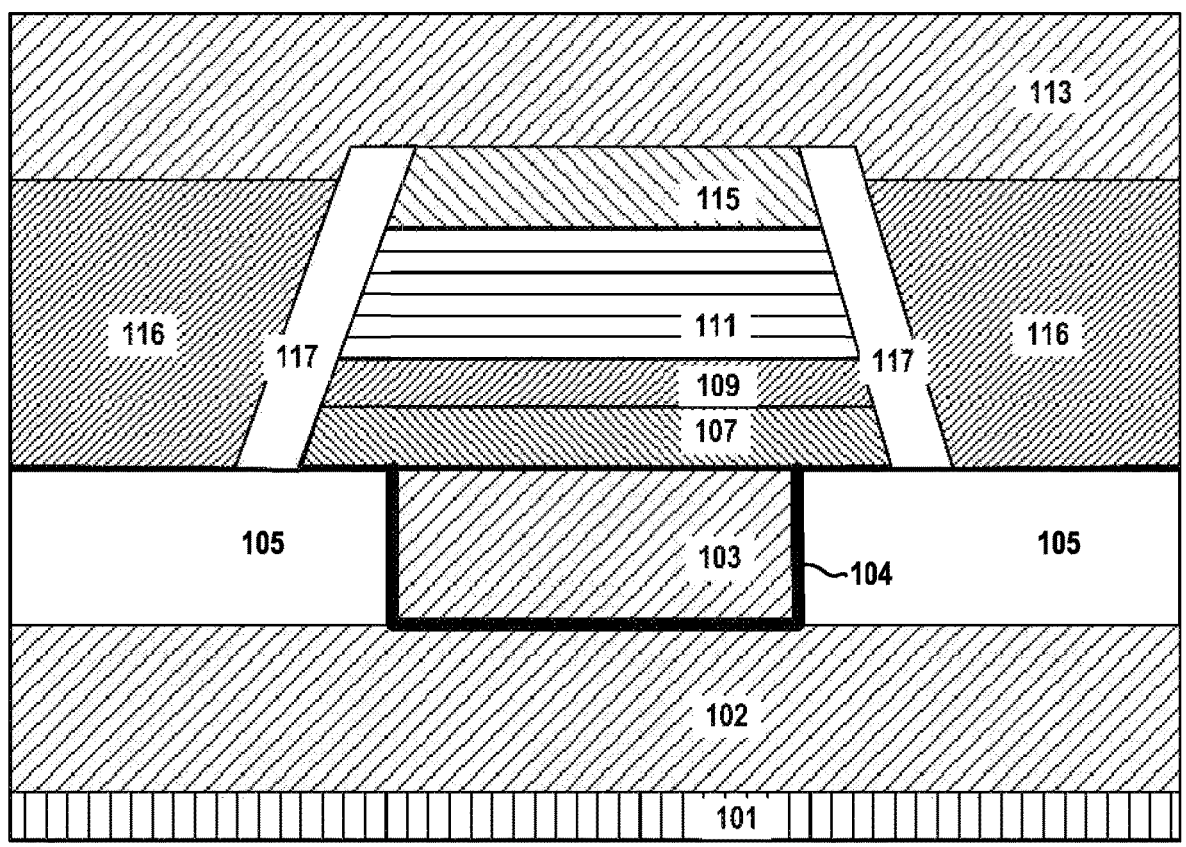
FIG. 8 is a cross-sectional diagram depicting the structure according to a first embodiment of the invention after an encapsulation layer, an inter-layer dielectric (ILD) and top interconnect deposition processes are performed.

FIG. 8 is a cross-sectional diagram depicting the structure according to a first embodiment of the invention after an encapsulation layer, an inter-layer dielectric (ILD) and top interconnect deposition processes are performed. In embodiments of the invention, the encapsulation layer 117 is made of an insulator material such as SiN or SiC. In other embodiments, other insulators are used. A chemical vapor deposition (CVD), a plasma enhanced chemical vapor deposition (PECVD), a physical vapor deposition (PVD) or an atomic layer deposition (ALD) are used deposit the encapsulation layer in different embodiments of the invention. Typically, the encapsulation layer 117 has a thickness from 1 nm to 800 nm with a thickness from 5 nm to 500 nm being more preferred in respective embodiments.

The inter-layer dielectric (ILD) 116 is a dielectric such as SiO2. A representative range of thicknesses for the ILD layer is from 50 nm to 900 nm with a thickness from 100 nm to 700 nm being more preferred in respective embodiments. In preferred embodiments, the top interconnect 113 is formed from similar materials as the bottom interconnect 102, e.g., a conductive material such as W, Cu, Al, or alloys thereof. Similar deposition processes as discussed above for the bottom interconnect are performed to produce the top interconnect layer 113. The top interconnect layer 113 has a thickness from 10 nm to 800 nm with a thickness from 30 nm to 500 nm being more preferred in respective embodiments.

In the final structure of this embodiment, the bottom pedestal 107, the top pedestal 109, MTJ layer 111 and hard mask layer 115 are conical sections or truncated cones having parallel top and bottom surfaces. These layers are encapsulated by the encapsulation layer 113. The microstud 103 is a cylinder and is fully inside the recess of the insulator 105. The bottom surface and top surface of the bottom pedestal 107 are planar due to the planarization step before the deposition of the bottom pedestal material. The top and bottom surfaces of the top pedestal also are planar as the planarization will be transmitted to overlaying layers. Also as mentioned above, a planarization of the top pedestal 109 occurs to the top surface of the top pedestal.

In other embodiments, the MRAM cell may be pseudo-conical, e.g., an elliptical cone or smoothed pyramid. That is, for the current invention, a "smoothed" surface without sharp edges is preferred from a performance perspective. Thus, the various layers exposed to the ion bombardment step will be pseudo-conical sections in terms of their shape in the final structure. Therefore, as discussed and claimed in the description a "conical" shape or a "conical" subsection is intended to include shapes that are not perfectly conical but are smoothed by the ion bombardment.

Figure 9:
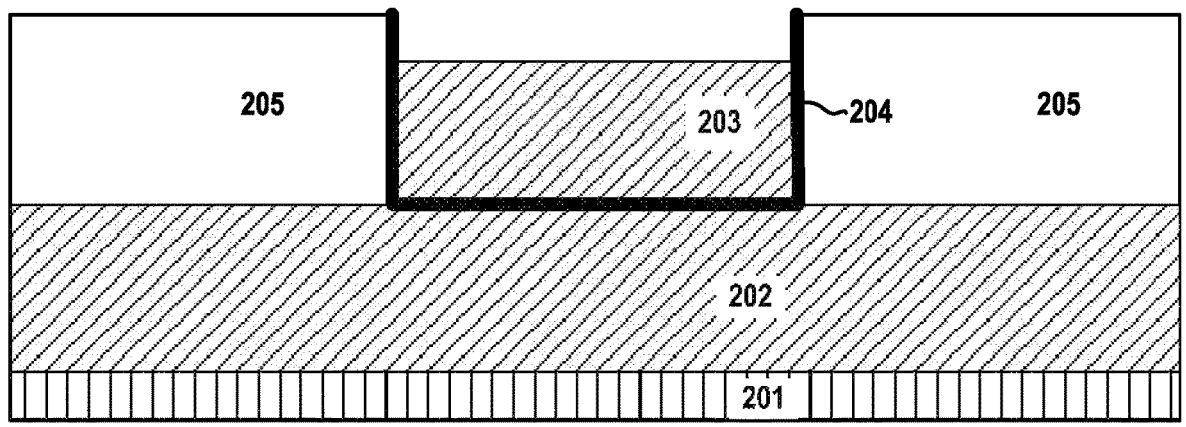
FIG. 9 is a cross-sectional diagram depicting the structure of an intermediate structure including a bottom conductor contact over a bottom interconnect according to a second embodiment of the invention.

FIG. 9 is a cross-sectional diagram depicting the structure of an intermediate structure including a bottom conductor contact over a bottom interconnect according to a second embodiment of the invention. Layers 201, 202 and 204 are respectively similar to those discussed above for layers 101, 102 and 104 in connection with the preceding figures. In this embodiment, the microstud 203 is recessed in the opening of the insulator 205. A planarization step is used to remove the microstud material the barrier layer material from the field areas of the insulator 205. A number of processes can be used to form the recess. In one embodiment, a planarization process follows a metal fill of the recess. The planarization can be a controlled chemical mechanical polishing (CMP) process which through a selected load-down force and polishing slurry, a dish-like feature is created on the metal surface of the recess. This is sometimes called "CMP dishing". The CMP dishing process can be followed by an anneal or an etch to get the stepped profile shown in the figures.

Figure 10:
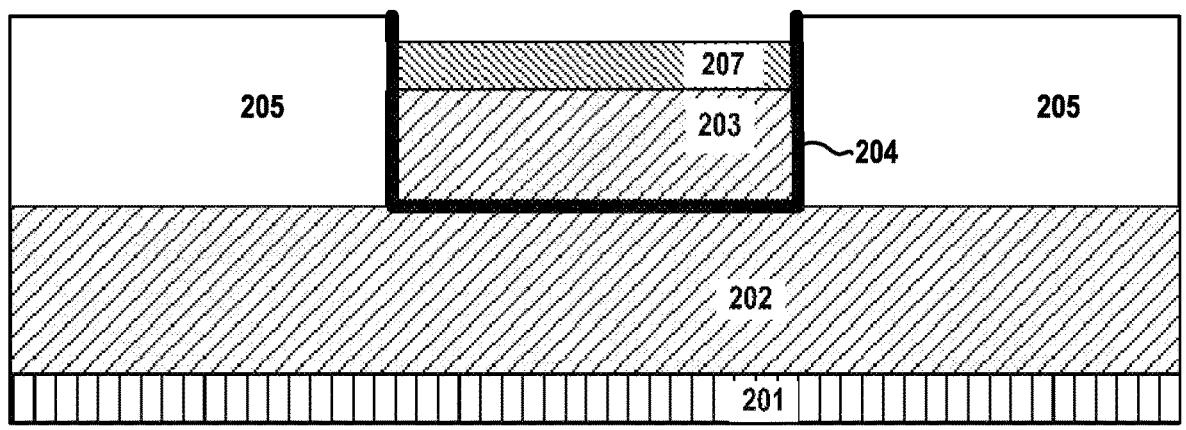
FIG. 10 is a cross-sectional diagram depicting the structure according to a second embodiment of the invention after a selective deposition is performed to form on the bottom layer of the bilayer pedestal.

FIG. 10 is a cross-sectional diagram depicting the structure according to a second embodiment of the invention after a selective deposition is performed to form on the bottom layer of the bilayer pedestal. The selective deposition is used to deposit the bottom pedestal layer 207 over the microstud 203. Note that a slight recess still remains over the bottom pedestal layer. The microstud 203 has a thickness from 3 nm to 280 nm with a thickness from 4 nm to 250 nm being more preferred in respective embodiments. The bottom pedestal layer 107 has a thickness from 1 nm to 200 nm with a thickness from 2 nm to 100 nm being more preferred in respective embodiments.

Figure 11:
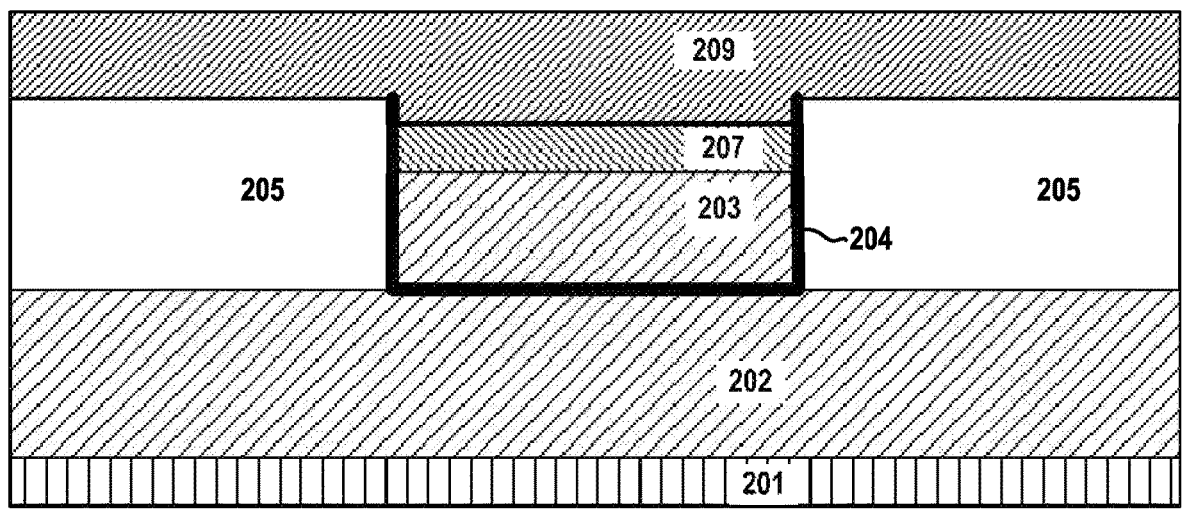
FIG. 11 is a cross-sectional diagram depicting the structure according to a second embodiment of the invention after a top layer of the bilayer pedestal is deposited.

FIG. 11 is a cross-sectional diagram depicting the structure according to a second embodiment of the invention after a top layer of the bilayer pedestal is deposited. The top pedestal layer 209 fills in the slight recess over the bottom pedestal layer 207 and covers the field areas over the insulator 205. As deposited, the top pedestal layer 209 has a thickness from 5 nm to 300 nm with a selected thickness in the range from 10 nm to 200 nm being more preferred in respective embodiments.

Figure 12:
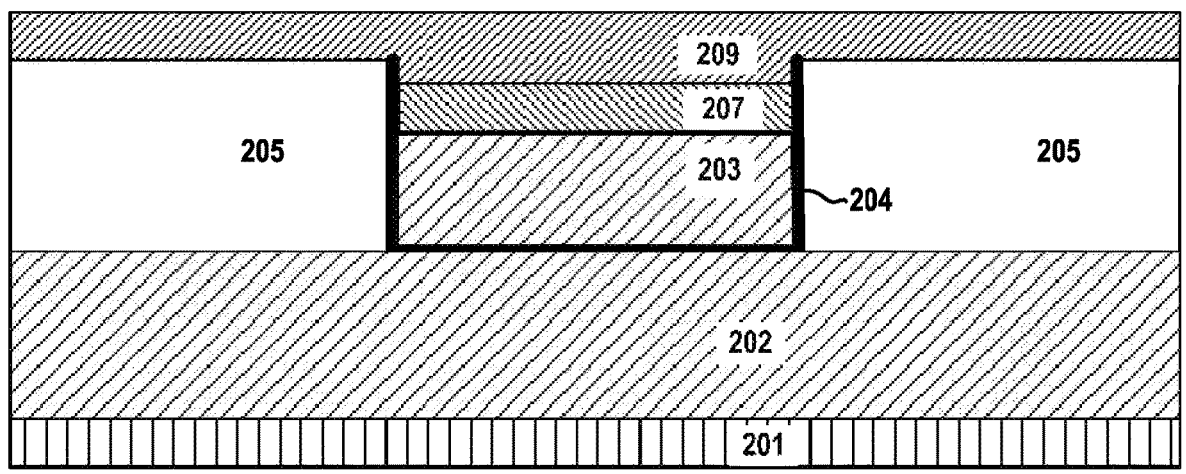
FIG. 12 is a cross-sectional diagram depicting the structure according to a second embodiment of the invention after a planarization process is performed on the top layer of the bilayer pedestal.

FIG. 12 is a cross-sectional diagram depicting the structure according to a second embodiment of the invention after a planarization process is performed on the top layer of the bilayer pedestal. A common planarization process such as CMP is used to thin and planarize the top pedestal layer 209. As discussed above, having a smooth top surface of the top pedestal 209 is important for the subsequent layers and the planarization process provides that type of surface. After planarization, the top pedestal layer 209 has a thickness from 4 nm to 280 nm with a thickness from 8 nm to 180 nm being more preferred in respective embodiments.

Figure 13:
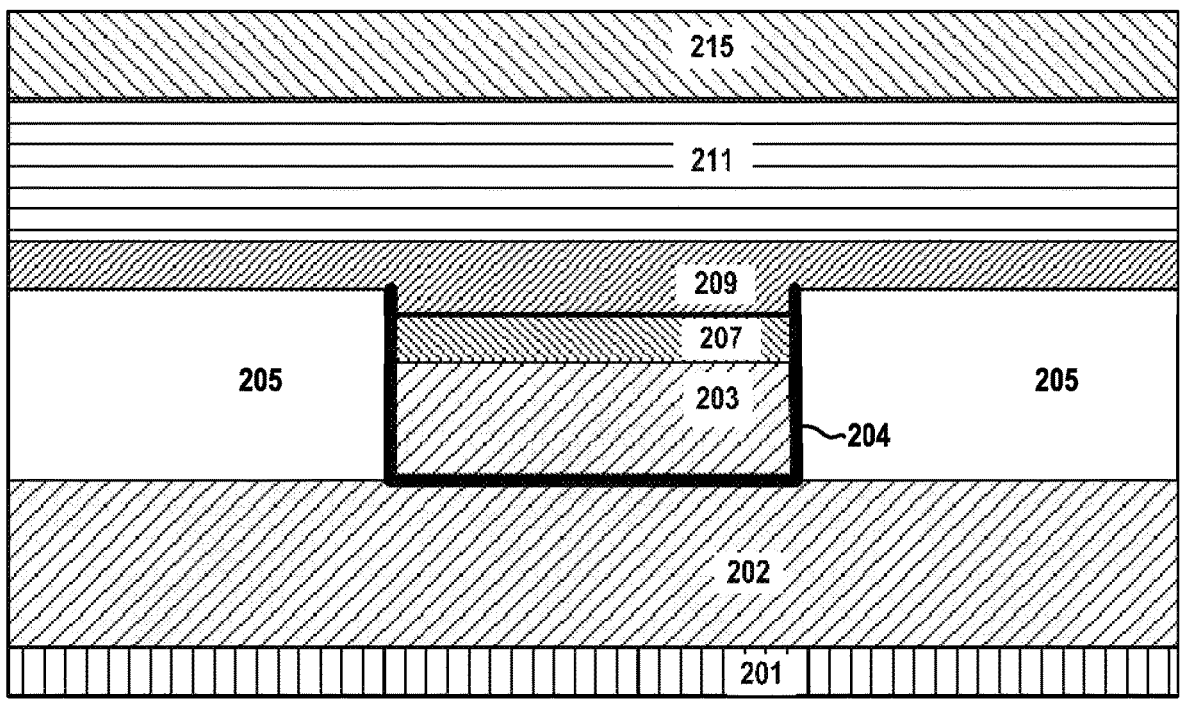
FIG. 13 is a cross-sectional diagram depicting the structure according to a second embodiment of the invention after a magnetic tunnel junction (MTJ) material layer and hard mask layer are deposited.

FIG. 13 is a cross-sectional diagram depicting the structure according to a second embodiment of the invention after a magnetic tunnel junction (MTJ) material layer 211 and hard mask layer 215 are deposited. The thickness, materials and processes are similar to those described above in reference to the first embodiment.

Figure 14:
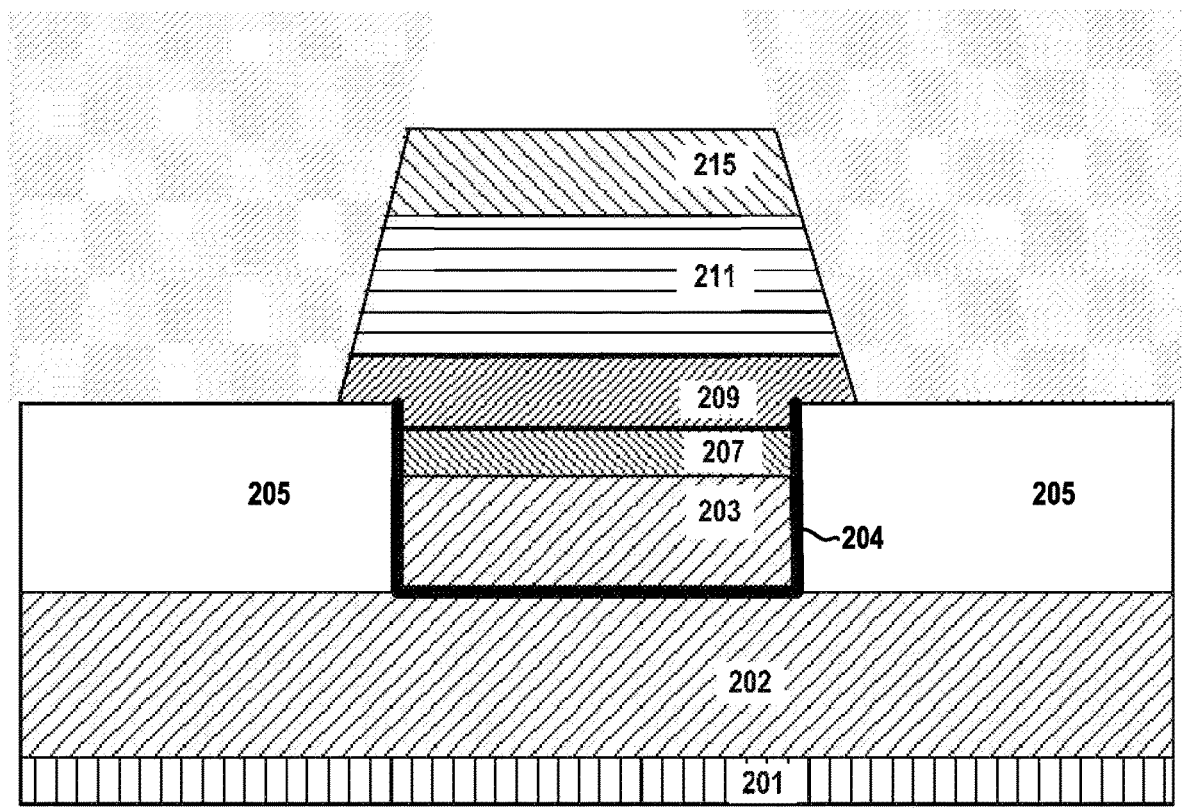
FIG. 14 is a cross-sectional diagram depicting the structure according to a second embodiment of the invention after an Ion-beam etch (IBE) process is performed.

FIG. 14 is a cross-sectional diagram depicting the structure according to a second embodiment of the invention after an Ion-beam etch (IBE) process is performed. While the MRAM cell has the same angular profile, here as compared to the first embodiment, the top pedestal 209 of the pedestal has a larger horizontal dimension than the bottom pedestal 207. The bottom pedestal 207 has a top surface which is below the top surface of the insulator 105 and is completely embedded in the recess. The top pedestal 209 is partially embedded in the recess above the microstud 203 and bottom pedestal 207. The top pedestal 209 extends higher than the insulator 205 and extends over the edge of the recess horizontally, protecting the microstud 203 and bottom pedestal 207 from the IBE process.

An encapsulation layer, an inter-layer dielectric (ILD) and top interconnect deposition processes are performed as described above in connection with the first embodiment, over the structure shown in FIG. 14. In the final structure of this embodiment, the MTJ layer 211 and hard mask layer 215 are conical sections or truncated cones having parallel top and bottom surfaces. The top pedestal 209 has a top portion which is a conical section and a bottom portion which is a cylinder. The bottom pedestal 207 and the microstud 203 are cylinders. Although not depicted, the top pedestal 209, MTJ layer 211 and the hard mask layer 215 are encapsulated by the encapsulation layer. The bottom portion of the top pedestal 209, the bottom pedestal 207 and the microstud 203 are inside the recess of the insulator layer 205. The top surface of the top pedestal 209 is planar due to its planarization in this embodiment of the invention.

Figure 15:
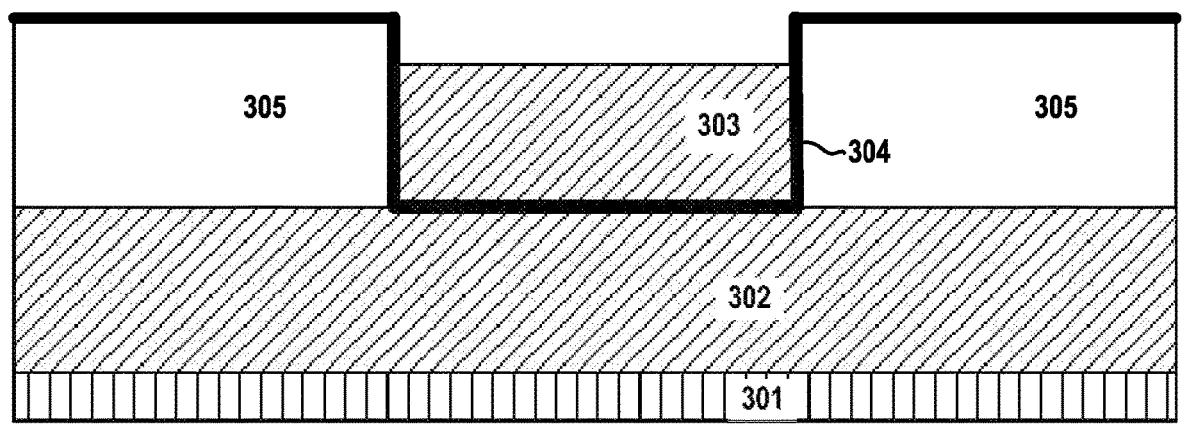
FIG. 15 is a cross-sectional diagram depicting the structure of an intermediate structure including a bottom conductor contact over a bottom interconnect according to a third embodiment of the invention.

FIG. 15 is a cross-sectional diagram depicting the structure of an intermediate structure including a bottom conductor contact over a bottom interconnect according to a third embodiment of the invention. Layers 301 and 302 are respectively similar to those discussed above for layers 101 and 102 and 201 and 202 in connection with the preceding figures. In this embodiment, the barrier layer 304 is left on the field areas of the insulator 305. In embodiments of the invention, a small recess is left over the top surface of the microstud 303. A number of processes can be used to form the recess. In one embodiment, a planarization process follows a metal fill of the recess. The planarization can be a controlled chemical mechanical polishing (CMP) process which through a selected load-down force and polishing slurry, a dish-like feature is created on the metal surface of the recess. This is sometimes called "CMP dishing". The CMP dishing process can be followed by an anneal or an etch to get the stepped profile shown in the figures.

Figure 16:
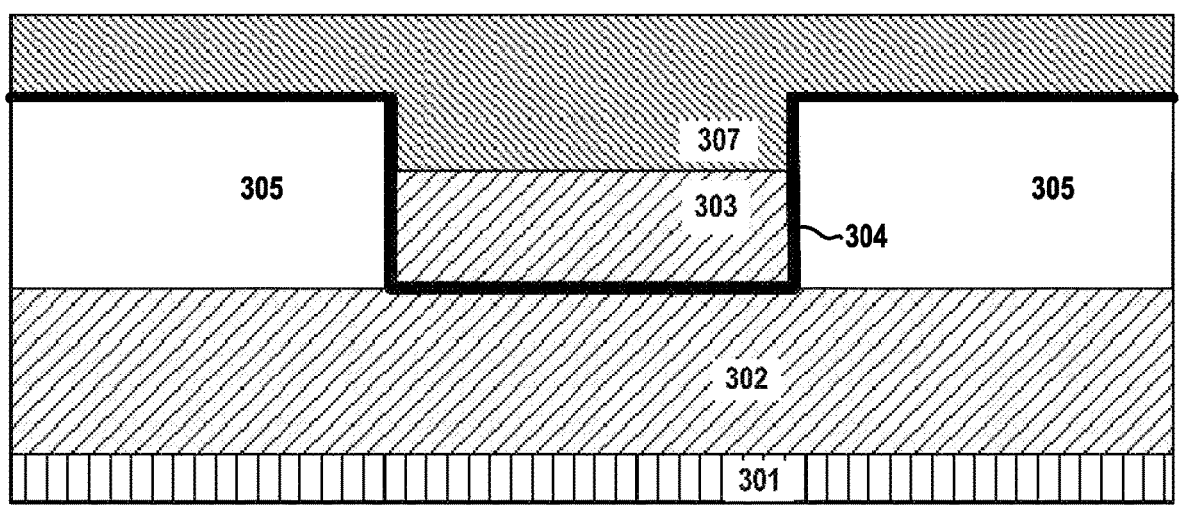
FIG. 16 is a cross-sectional diagram depicting the structure according to a third embodiment of the invention after a deposition is performed to form the bottom layer of the bilayer pedestal.

FIG. 16 is a cross-sectional diagram depicting the structure according to a third embodiment of the invention after a deposition is performed to form the bottom layer of the bilayer pedestal. In this embodiment, the bottom pedestal layer 307 fills the small recess on top of the microstud 303 and covers the barrier layer 304 on the sides of the small recess and in the field areas of the insulator 305. Materials and processes as discussed in the first and second embodiments can be used to deposit the lower pedestal layer material. Depending on whether the top surface of the microstud 303 remains dished or is planar due to processing will determine the shape of the bottom surface of the bottom pedestal as it will conform to the underlying surface.

Figure 17:
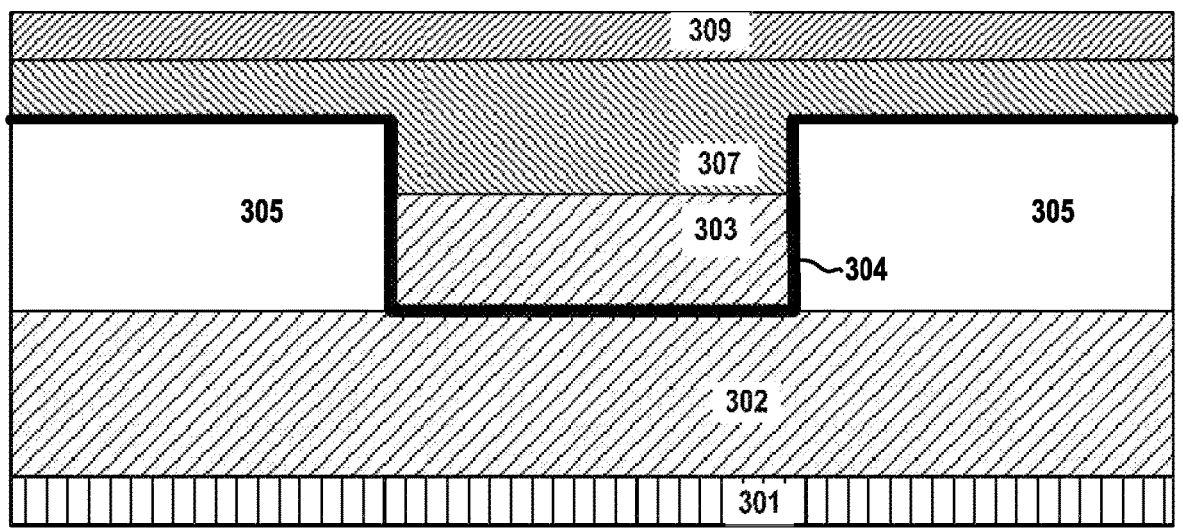
FIG. 17 is a cross-sectional diagram depicting the structure according to a third embodiment of the invention after a top layer of the bilayer pedestal is deposited and planarized.

FIG. 17 is a cross-sectional diagram depicting the structure according to a third embodiment of the invention after a top layer of the bilayer pedestal is deposited and planarized. This drawing shows the top pedestal layer 309 after deposition and planarization. Materials and processes as described above for the first and second embodiments can be used to deposit the top pedestal material. Planarization processes such as CMP are then used to planarize and thin the layer 309.

Figure 18:
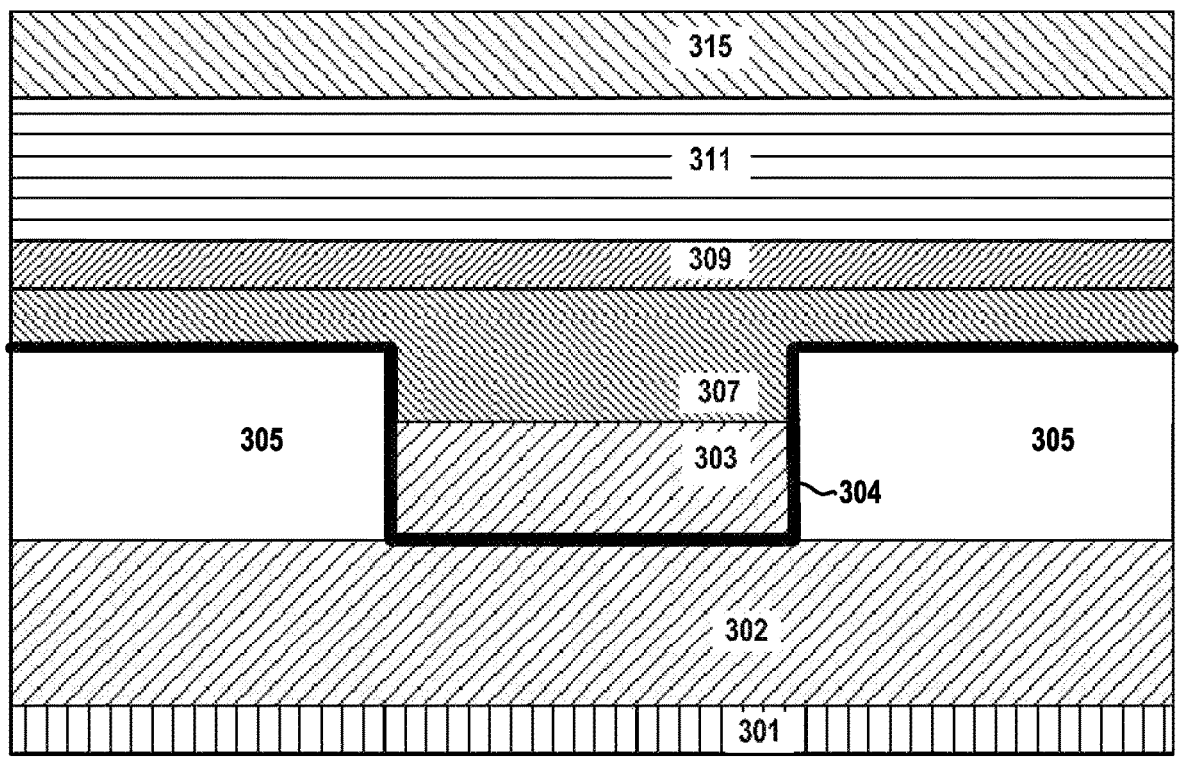
FIG. 18 is a cross-sectional diagram depicting the structure according to a third embodiment of the invention after a magnetic tunnel junction (MTJ) material layer and hard mask layer are deposited.

FIG. 18 is a cross-sectional diagram depicting the structure according to a third embodiment of the invention after a magnetic tunnel junction (MTJ) material layer 311 and hard mask layer 315 are deposited. The thicknesses, materials and processes are similar to those described above in reference to the first and second embodiments.

Figure 19:
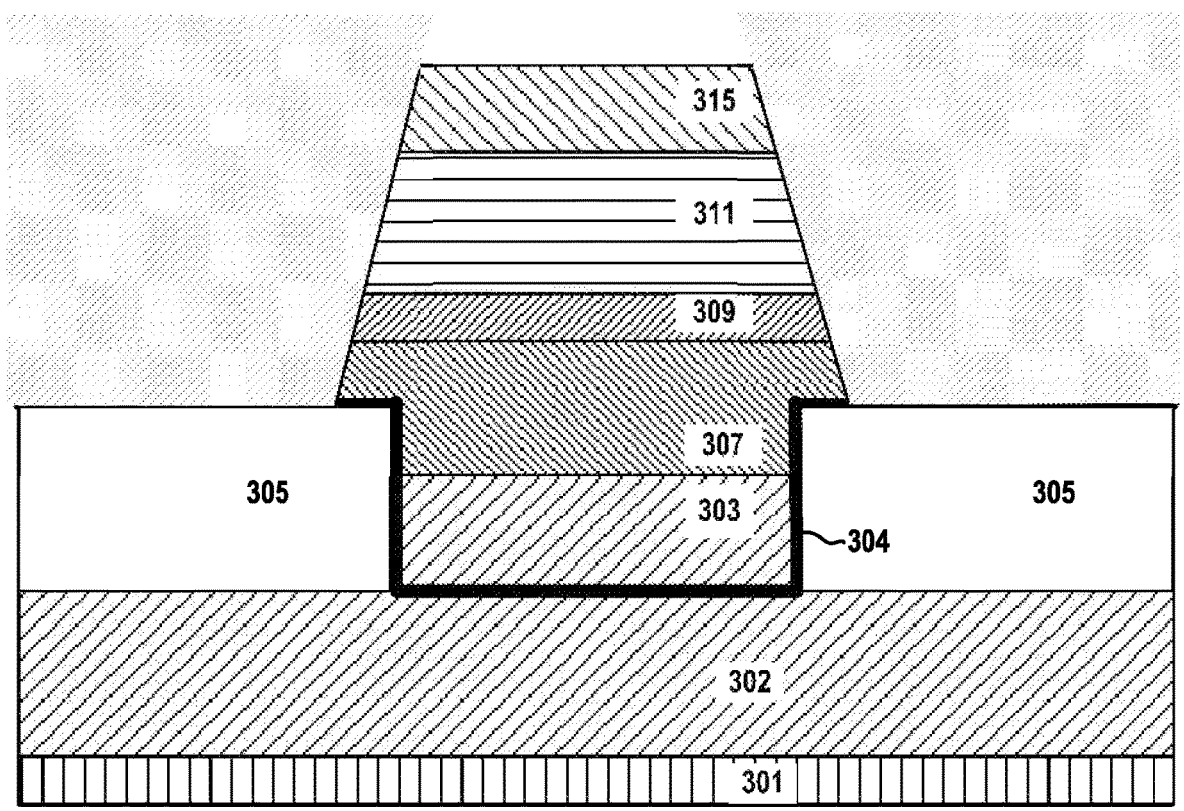
FIG. 19 is a cross-sectional diagram depicting the structure according to a third embodiment of the invention after an Ion-beam etch (IBE) process is performed.

FIG. 19 is a cross-sectional diagram depicting the structure according to a third embodiment of the invention after an Ion-beam etch (IBE) process is performed. While the MRAM cell has the same angular profile, here as compared to the first and second embodiments, the top pedestal 309 of the pedestal has a smaller horizontal dimension than the bottom pedestal 307. The bottom pedestal 307 is partially embedded in the recess above the microstud 303 and extends over the edge of the recess horizontally, protecting the microstud 303 and the remaining portion of the barrier layer 304 from the IBE process. Note that there is a small protected portion of the barrier layer 304 left on the top surface of the insulator 305 after the IBE process.

An encapsulation layer, an inter-layer dielectric (ILD) and top interconnect deposition processes are performed as described above in connection with the first and second embodiments, over the structure shown in FIG. 19. In the final structure of this embodiment, the top pedestal 309, the MTJ layer 311 and hard mask layer 315 are conical sections or truncated cones having parallel top and bottom surfaces. The bottom pedestal 309 has a top portion which is a conical section and a bottom portion which is a cylinder. The microstud 303 is a cylinder. Although not depicted, the top pedestal 309, MTJ layer 311, the hard mask layer 315 and top portion of the bottom pedestal 307 are encapsulated by the encapsulation layer. The bottom portion of the bottom pedestal 307 and the microstud 303 are inside the recess of the insulator layer 205. The top surface of the top pedestal 309 is planar due to its planarization in this embodiment of the invention.

As is known to the art, the structure is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only a limited number of features are illustrated in the drawings, those ordinarily skilled in the art would understand that many different types of features could be simultaneously formed with the embodiments herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a bottom electrode for an integrated circuit device comprising:
   providing a first dielectric layer over a substrate, the first dielectric layer having recess therein;
   forming a microstud layer disposed completely within the recess of the dielectric and conforming to the recess;
   forming a bottom pedestal layer disposed on a top surface of the microstud layer, wherein a material used for the bottom pedestal layer has a lower electrochemical voltage than a material used for the microstud layer;
   forming a barrier layer wherein the barrier layer separates the bottom pedestal layer from the first dielectric layer and conforms to the recess;
   forming a top pedestal layer over a top surface of the bottom pedestal layer; and
   forming a conductive element of the integrated circuit device on a top surface of the bottom electrode;
   wherein a first portion of the bottom pedestal layer is disposed in and conforms to the recess and a second portion of the bottom pedestal layer is outside the recess and extends laterally beyond a top of the recess and wherein the barrier layer separates the second portion of the bottom pedestal layer from the first dielectric layer, the top pedestal and the conductive element are conical sections, and wherein the microstud layer, the bottom pedestal layer and the top pedestal layer are layers in the bottom electrode.

2. The method as recited in claim 1, wherein the conductive element of the integrated circuit device is a memory cell.

3. The method as recited in claim 2, wherein the memory cell is a Magnetoresistive random-access memory (MRAM) cell.

4. The method as recited in claim 3, further comprising:
   forming a bottom conductor over the substrate;
   forming a first barrier layer on the first dielectric layer including in the recess, wherein the microstud layer is formed on top of the barrier layer; and
   forming a top conductor on top of a top surface of the conductive element.

5. The method as recited in claim 1, wherein the integrated circuit device is a Magnetoresistive random-access memory (MRAM) device.

6. A method for fabricating a bottom electrode for an integrated circuit device comprising:
   providing a first dielectric layer over a substrate, the first dielectric layer having recess therein;
   forming a microstud layer disposed completely within the recess of the dielectric and conforming to the recess in a first portion of the recess, wherein a second, stepped portion of the recess is empty;
   forming a bottom pedestal layer disposed on a top surface of the microstud layer, wherein a material used for the bottom pedestal layer has a lower electrochemical voltage than a material used for the microstud layer, wherein a first portion of the bottom pedestal layer is in the second portion of the recess and is a cylinder and a second portion of the bottom pedestal layer is a conical section; and
   forming a top pedestal layer on a top surface of the bottom pedestal layer; and
   forming a conductive element of the integrated circuit device on a top surface of the bottom electrode;
   wherein a first portion of the bottom pedestal layer is disposed in and conforms to the recess and a second portion of the bottom pedestal layer is outside the recess, the top pedestal and the conductive element are conical sections, and wherein the microstud layer, the bottom pedestal layer and the top pedestal layer are layers in the bottom electrode.

7. The method as recited in claim 6 further comprising:
   after depositing the microstud layer in the recess, performing planarization process;
   after the planarization process, performing an anneal or an etching process to obtain the second, stepped portion of the recess.

8. A method for fabricating a bottom electrode for an integrated circuit device comprising:
   providing a first dielectric layer over a substrate, the first dielectric layer having recess therein;
   forming a bottom electrode, the bottom electrode consisting of a microstud layer disposed completely within the recess of the dielectric and conforming to the recess, a bottom pedestal layer disposed on a top surface of the microstud layer conforming to the recess and also extending laterally beyond a top of the recess, wherein a material used for the bottom pedestal layer has a lower electrochemical voltage than a material used for the microstud layer, a barrier layer which separates the bottom pedestal layer from the first dielectric layer both in the recess and laterally beyond the top of the recess and a top pedestal layer on a top surface of the bottom pedestal; and
   forming a conductive element of the integrated circuit device on a top surface of the bottom electrode;
   wherein a first portion of a bilayer pedestal consisting of the bottom pedestal layer and the top pedestal layer is disposed in and conforms to a shape of the recess formed in the first dielectric layer and a second portion of the bilayer pedestal and the conductive element are conical sections.

9. The method as recited in claim 8, wherein a first portion of the bottom pedestal layer is in the first portion of the bilayer pedestal and a second portion of the bottom pedestal layer is in the second portion of the bilayer pedestal and the second portion of the bottom pedestal has a width dimension greater than any width dimension of the first portion of the bottom pedestal.

10. A method for fabricating a bottom electrode for an integrated circuit device comprising:
   in a recess in a dielectric layer, forming a microstud layer disposed completely within the recess of the dielectric layer and conforming to the recess and leaving a remainder portion of the recess empty of the microstud layer, wherein the remainder portion of the recess is formed by a planarization process followed an anneal leaving a stepped profile in the dielectric layer;
   forming a bottom pedestal layer disposed on a top surface of the microstud layer, completely filling the remainder portion of the recess and disposed over a top surface of the dielectric layer wherein a material used for the bottom pedestal layer has a lower electrochemical voltage than a material used for the microstud layer, and
   forming a top pedestal layer on a top surface of the bottom pedestal layer, wherein a different material is selected for the top pedestal layer than the material user for the bottom pedestal layer; and
   forming a conductive element of the integrated circuit device on a top surface of the bottom electrode; wherein the top pedestal and the conductive element are conical sections and
   wherein the microstud layer, the bottom pedestal layer and the top pedestal layer are layers in the bottom electrode.

11. The method as recited in claim 10, wherein the remainder portion of the recess is formed by a planarization process followed or an etch leaving a stepped profile in the dielectric layer.

12. The method as recited in claim 11, wherein a first portion of the bottom pedestal layer is disposed on a top surface of the microstud layer and completely fills the remainder portion of the recess and a second portion of the bottom pedestal layer is disposed over a top surface of the dielectric layer and the second portion of the bottom pedestal has a width dimension greater than any width dimension of the first portion of the bottom pedestal.

\* \* \* \* \*